United States Patent
Sekiguchi et al.

(10) Patent No.: US 11,837,400 B2
(45) Date of Patent: Dec. 5, 2023

(54) ELECTRONIC COMPONENT SURFACE-MOUNTABLE ON CIRCUIT BOARD

(71) Applicant: TAIYO YUDEN CO., LTD., Tokyo (JP)

(72) Inventors: Takayuki Sekiguchi, Tokyo (JP); Tsuyoshi Ogino, Tokyo (JP); Takao Shibuya, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 738 days.

(21) Appl. No.: 17/007,857

(22) Filed: Aug. 31, 2020

(65) Prior Publication Data

US 2020/0402691 A1    Dec. 24, 2020

Related U.S. Application Data

(63) Continuation of application No. 16/844,386, filed on Apr. 9, 2020, now Pat. No. 10,804,016, which is a
(Continued)

(30) Foreign Application Priority Data

Sep. 30, 2016    (JP) .................................. 2016-194284

(51) Int. Cl.
*H01S 4/00*    (2006.01)
*H01F 5/04*    (2006.01)
(Continued)

(52) U.S. Cl.
CPC ............. *H01F 5/04* (2013.01); *H01F 27/292* (2013.01); *H01F 41/04* (2013.01);
(Continued)

(58) Field of Classification Search
CPC .......... H01F 41/04; H01F 5/04; H01F 27/292; H01F 2005/046; H01F 2027/065; H05K 2201/10636
See application file for complete search history.

(56) References Cited

U.S. PATENT DOCUMENTS

| 2012/0194965 A1 | 8/2012 | Kuroda et al. |
| 2014/0034372 A1* | 2/2014 | Hasegawa ................ H05K 3/46 |
| | | 29/846 |

(Continued)

FOREIGN PATENT DOCUMENTS

| JP | 2000-013167 A | 1/2000 |
| JP | 2006-324489 A | 11/2006 |
| JP | 2015-065284 A | 4/2015 |

OTHER PUBLICATIONS

Notice of Reasons for Refusal dated Aug. 4, 2020 issued in corresponding Japanese Patent Application No. 2016-194284 with English translation.

*Primary Examiner* — Paul D Kim
(74) *Attorney, Agent, or Firm* — Pillsbury Winthrop Shaw Pittman, LLP

(57) ABSTRACT

One object is to provide an electronic component in which a standoff for filling solder is maintained. An electronic component according to an embodiment of the present invention is configured to be surface-mountable on a circuit board. The electronic component includes: an insulating base member; an internal conductor provided in the base member; a first external electrode provided on the mounting surface of the base member so as to be electrically connected to the internal conductor; and a second external electrode provided on the mounting surface of the base member so as to be electrically connected to the internal conductor. The first external electrode has a first protrusion, and the second external electrode has a second protrusion. The first protru-
(Continued)

sion and the second protrusion enables a standoff for filling solder to be maintained within a region defined by the mounting surface of the base member and the circuit board.

11 Claims, 11 Drawing Sheets

Related U.S. Application Data continuation of application No. 16/523,561, filed on Jul. 26, 2019, now Pat. No. 10,658,098, which is a continuation of application No. 16/117,458, filed on Aug. 30, 2018, now Pat. No. 10,418,162, which is a continuation of application No. 15/704,409, filed on Sep. 14, 2017, now Pat. No. 10,090,089.

(51) Int. Cl.
*H01F 41/04* (2006.01)
*H01F 27/29* (2006.01)
*H01F 27/06* (2006.01)

(52) U.S. Cl.
CPC .. *H01F 2005/046* (2013.01); *H01F 2027/065* (2013.01); *H05K 2201/10636* (2013.01)

(56) References Cited

U.S. PATENT DOCUMENTS

| | | |
|---|---|---|
| 2015/0084481 A1 | 3/2015 | Mori et al. |
| 2017/0099727 A1 | 4/2017 | Son |
| 2018/0047484 A1 | 2/2018 | Mori et al. |

* cited by examiner

ELECTRONIC COMPONENT SURFACE-MOUNTABLE ON CIRCUIT BOARD

CROSS-REFERENCE TO RELATED APPLICATIONS

This application is a continuation of U.S. application Ser. No. 16/844,386, filed Apr. 9, 2020, now U.S. Pat. No. 10,804,016, which is a continuation of U.S. application Ser. No. 16/523,561, filed Jul. 26, 2019, now U.S. Pat. No. 10,658,098, which is a continuation of U.S. application Ser. No. 16/117,458, filed on Aug. 30, 2018, now U.S. Pat. No. 10,418,162, which is a continuation of U.S. application Ser. No. 15/704,409, filed on Sep. 14, 2017, now U.S. Pat. No. 10,090,089, which is based on and claims the benefit of priority from Japanese Patent Application Serial No. 2016-194284 (filed on Sep. 30, 2016), the contents of each of which is hereby incorporated by reference in their entireties.

TECHNICAL FIELD

The present disclosure is related to an electronic component surface-mountable on a circuit board. More specifically, the present disclosure is related to an electronic component soldered to a circuit board.

BACKGROUND

In general, an electronic component surface-mountable on a circuit board includes an insulating base member, a circuit element (an inductor, capacitor, etc.) embedded in the base member, and external electrodes electrically connected to the circuit element. In most cases, an electronic component is joined to a circuit board by soldering. In order to solder an electronic component to a circuit board, a gap (herein also referred to as "standoff") for filling solder is required between the electronic component and the circuit board.

Some conventional electronic components are configured such that the mounting surface of the base member and the external electrodes are flush with each other. In particular, electronic components manufactured by photolithography are configured such that the mounting surface of the base member and the external electrodes are flush with each other because of its manufacturing method. Conventional electronic components manufactured by photolithography are disclosed in Japanese Patent Application Publication No. 2006-324489 ("the '489 Publication"). The electronic component shown in FIG. 1 of the '489 Publication includes an insulating resin 104 and an external electrode 100 that are flush with each other.

When the mounting surface of the base member and the external electrode are flush with each other, a gap (standoff) for filling solder cannot be maintained between the electronic component and the circuit board. In addition, when the mounting surface of the base member and the external electrodes are flush with each other, it is difficult to remove the oxide film formed on the external electrodes during inspection using a contact probe, and as a result, the contact resistance of the contact probe is increased and inhibits accurate inspection.

SUMMARY

Accordingly, one object of the present disclosure is to provide an electronic component in which a standoff for filling solder is maintained. Another object of the present disclosure is to facilitate removal of the oxide film formed on the external electrodes of the electronic component during inspection using a contact probe. Other objects of the present invention will be apparent with reference to the entire description in this specification.

The electronic component according to an embodiment of the present invention is configured to be surface-mountable on a circuit board. The electronic component comprises: an insulating base member; an internal conductor provided in the base member; a first external electrode provided on the mounting surface of the base member so as to be electrically connected to the internal conductor; and a second external electrode provided on the mounting surface of the base member so as to be electrically connected to the internal conductor. In an embodiment of the present invention, the base member includes a pair of principal surfaces opposed to each other, a pair of end surfaces opposed to each other, and a pair of side surfaces opposed to each other. The outer surface of the base member is defined by the pair of principal surfaces, the pair of end surfaces, and the pair of side surfaces. Of the pair of principal surfaces of the base member, the surface that faces the circuit board when the electronic component is mounted may be herein referred to as "the mounting surface" of the base member. Further, the pair of principal surfaces may be referred to as the mounting surface and the top surface for discrimination. The pair of end surfaces include a first end surface and a second end surface. The pair of side surfaces include a first side surface and a second side surface.

In an embodiment of the present invention, the first external electrode includes a first electrode portion and a second electrode portion, the first electrode portion being flush with the mounting surface of the base member, the second electrode portion being provided on the first end surface of the base member. In an embodiment of the present invention, the second external electrode includes a third electrode portion and a fourth electrode portion, the third electrode portion being flush with the mounting surface of the base member, the fourth electrode portion being provided on the second end surface of the base member.

In an embodiment of the present invention, the first external electrode has a first protrusion, and the second external electrode has a second protrusion. The first protrusion and the second protrusion enables a standoff for filling solder to be maintained within a region defined by the first external electrode, the second external electrode, the mounting surface of the base member, and the circuit board. Further, when inspecting the electrical characteristics of the electronic component using a contact probe, a larger pressure acts on the electronic component from the contact probe at the positions of the first protrusion and the second protrusion. With this pressure, the oxide film formed on the first external electrode and the second external electrode can be pushed away, so that the increase in the contact resistance value of the contact probe can be suppressed and the inspection can be performed accurately.

In an embodiment of the present invention, the first protrusion is formed at an end portion of the first external electrode on the first end surface side, and the second protrusion is formed at an end portion of the second external electrode on the second end surface side. Thus, a larger standoff can be maintained between the mounting surface of the base member and the circuit board.

In an embodiment of the present invention, each of the first and second protrusions has a height from the mounting surface of the base member equal to or greater than 5 μm. When a thin film (e.g., a Ni plating layer or a Sn plating layer) is formed on the surfaces of the first external electrode and the second external electrode, the height of the first protrusion and the height of the second protrusion do not include the height of the thin film. For example, when a Sn plating layer is formed on the surfaces of the first external electrode and the second external electrode, each of the first protrusion and the second protrusion not including the Sn plating layer has a height from the mounting surface of the base member equal to or greater than 5 µm. In an embodiment of the present invention, each of the first and second protrusions has a height from the mounting surface of the base member equal to or smaller than 50 µm.

In an embodiment of the present invention, the base member is formed such that the distance between the first end surface and the second end surface is larger than the distance between the first side surface and the second side surface and the distance between the first side surface and the second side surface is larger than the distance between the top surface and the mounting surface. Thus, even a low profile electronic component can have a standoff for filling solder maintained within a region defined by the first electrode portion of the first external electrode, the third electrode portion of the second external electrode, the mounting surface of the base member, and the circuit board.

In an embodiment of the present invention, the base member is formed such that the distance between the first end surface and the second end surface is larger than the distance between the first side surface and the second side surface and the distance between the top surface and the mounting surface is larger than the distance between the first side surface and the second side surface. Thus, even a high profile electronic component can have a standoff for filling solder maintained within a region defined by the first electrode portion of the first external electrode, the third electrode portion of the second external electrode, the mounting surface of the base member, and the circuit board.

In an embodiment of the present invention, the base member contains an insulating resin and a filler. According to this embodiment, use of a filler having a lower density than the resin reduces the weight of the electronic component.

In an embodiment of the present invention, the insulating resin is a transparent resin. According to this embodiment, an internal conductor provided in the resin can be viewed, and therefore, it is possible to confirm that the direction of the electronic component is correct when it is mounted.

In an embodiment of the present invention, each of the surface layers of the first and second external electrodes comprises a Sn layer. Thus, the solder wettability of the first external electrode and the second external electrode can be increased. The Sn layer is provided on each of the first external electrode and the second external electrode via a Ni layer.

ADVANTAGES

One object of the present disclosure is to provide an electronic component in which a standoff for filling solder is maintained. Another object of the present disclosure is to facilitate removal of the oxide film formed on the external electrodes of the electronic component during inspection using a contact probe. In an electronic component in which the mounting surface of the base member and the external electrodes are flush with each other, a standoff for filling solder can be maintained.

DESCRIPTION OF EXAMPLE EMBODIMENTS

Various embodiments of the invention will be described hereinafter with reference to the drawings. Elements common to a plurality of drawings are denoted by the same reference signs throughout said plurality of drawings. It should be noted that the drawings do not necessarily appear in accurate scales, for convenience of description.

Figure 1:
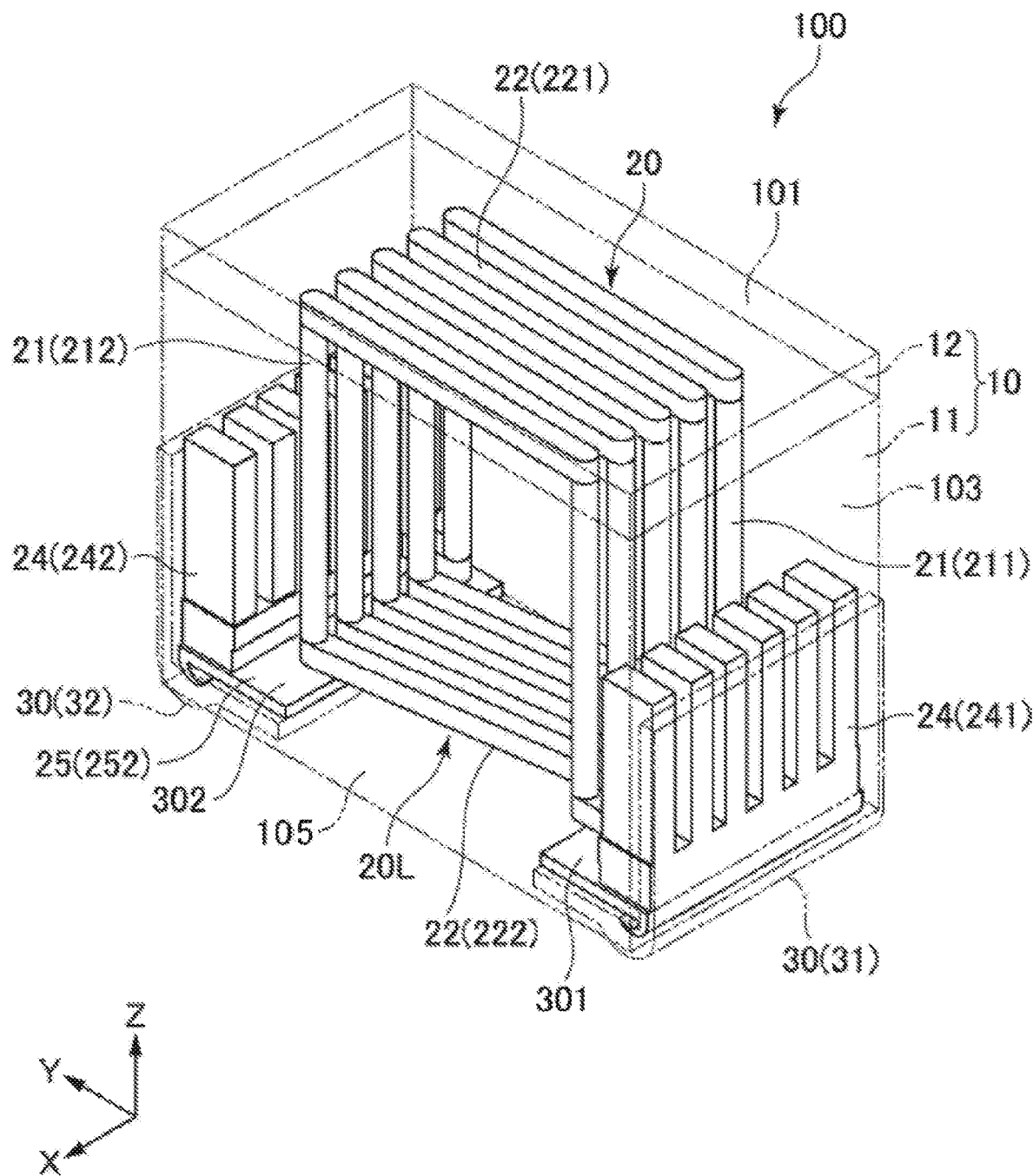
FIG. 1 is a schematic perspective view of an electronic component according to an embodiment of the present invention.
Figure 2:
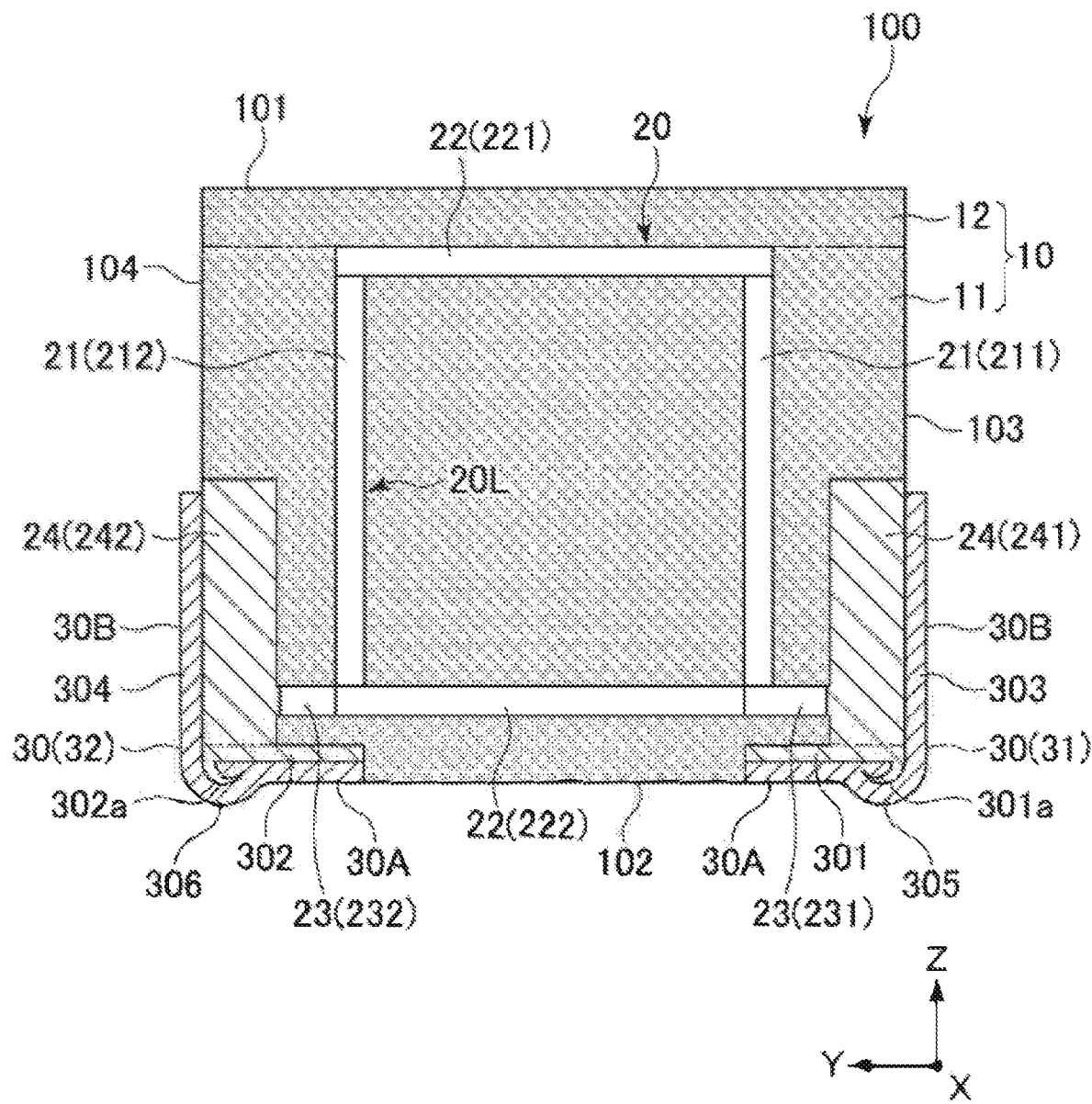
FIG. 2 is a schematic side view of the electronic component of FIG. 1.
Figure 3:
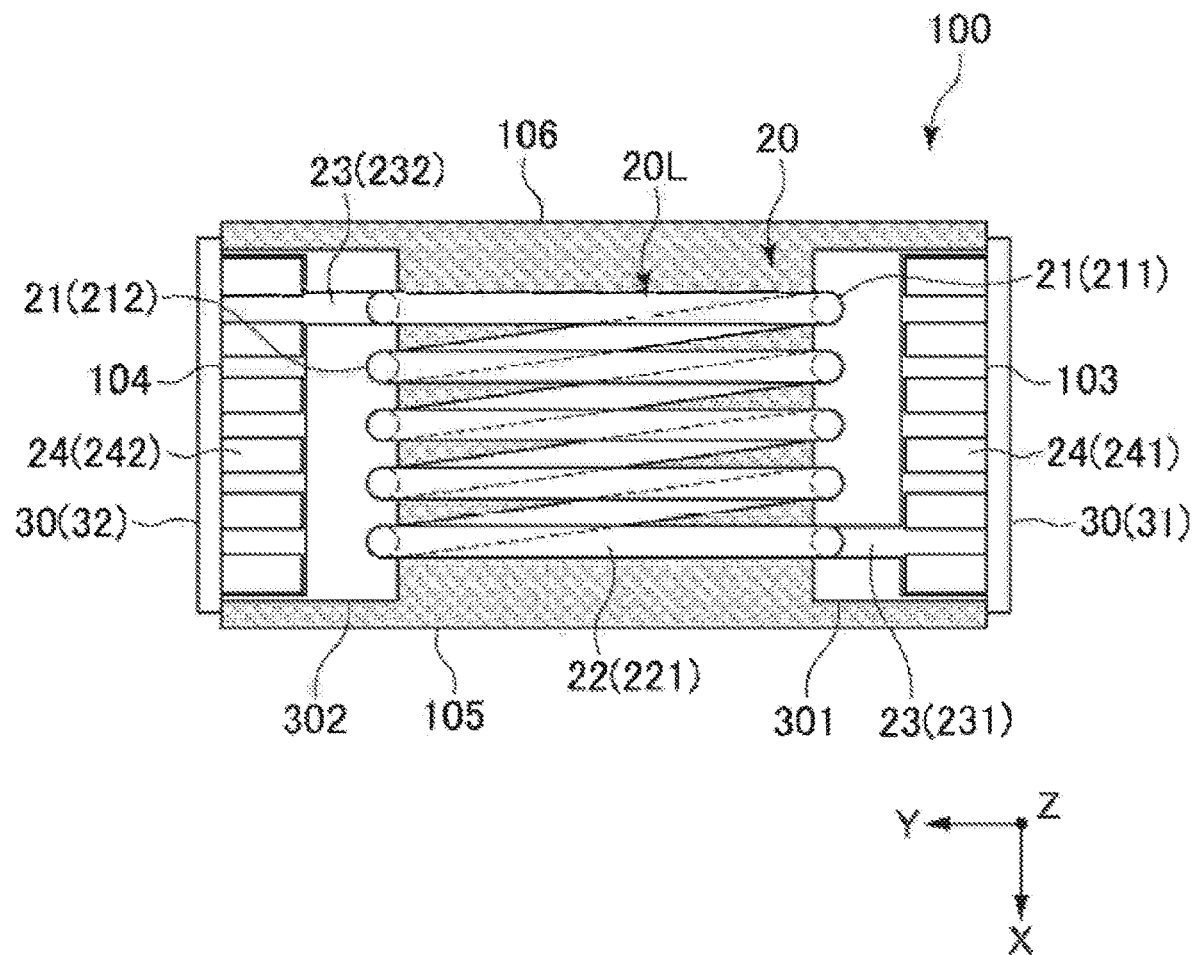
FIG. 3 is a schematic top view of the electronic component of FIG. 1.

FIG. 1 is a schematic perspective view of an electronic component according to an embodiment of the present invention, FIG. 2 is a schematic side view of the electronic component, and FIG. 3 is a schematic top view of the electronic component. These drawings show a surface-mountable coil element as an example of an electronic component. This coil element may be used for, e.g., eliminating noise in an electronic circuit. This coil element may be either a power inductor to be incorporated in a power supply line or an inductor used in a signal line. Further, electronic components to which the present invention is applicable are not limited to coil elements. The present invention is applicable to, e.g., capacitor elements, resistance elements, multilayer wiring boards, and various other electronic components, in addition to coil elements.

An electronic component 100 may include a base member 10, an internal conductor 20, and an external electrode 30. In this specification, the "width" direction, the "length" direction, and the "thickness" direction of the electronic component 100 correspond to the "X" direction, the "Y" direction" and the "Z" direction in FIG. 1, respectively, unless otherwise understood in accordance with the context.

The base member 10 may have a first principal surface 101, a second principal surface 102, a first end surface 103, a second end surface 104, a first side surface 105, and a second side surface 106. The outer surface of the base member 10 may be defined by these six surfaces. Since the second principal surface 102 faces the circuit board (not shown), it may also be referred to as "a mounting surface" in this specification.

In one embodiment of the present invention, the base member 10 may have a substantially rectangular parallelepiped shape. The base member 10 may have a rectangular parallelepiped shape with a width direction in the X axis direction, a length direction in the Y axis direction, and a height direction in the Z axis direction. The base member 10 may have a width (the dimension in the X direction) of 0.05 to 0.3 mm, a length (the dimension in the Y direction) of 0.1 to 0.6 mm, and a height (the dimension in the Z direction) of 0.05 to 0.5 mm.

In an embodiment of the present invention, the base member 10 may be formed such that the length thereof is larger than the width thereof and the width thereof is larger than the height thereof. In this case, the electronic component 100 may have a low profile. In an embodiment of the present invention, the base member 10 may be formed such that the height thereof is larger than the length thereof and the length thereof is larger than the width thereof. In this case, the electronic component 100 may have a high profile.

The base member 10 may include an insulator body 11 and an top surface layer 12. The internal conductor 20 may be embedded in the insulator body 11. In an embodiment of the present invention, the top surface layer 12 may be constituted by a printing layer having characters or numbers (e.g., a model number of the electronic component 100) printed thereon.

In an embodiment of the present invention, the insulator body 11 may be made of a resin in which a multitude of filler particles are dispersed. In another embodiment of the present invention, the insulator body 11 may be made of a resin including no filler particles. In an embodiment of the present invention, the resin contained in the insulator body 11 may be a thermosetting resin having excellent insulation properties.

In an embodiment of the present invention, the top surface layer 12 may be made of a resin in which a multitude of filler particles are dispersed, as may be the insulator body 11. It may also be possible that the top surface layer 12 is made of a resin film.

Examples of thermosetting resins used for the insulator body 11 include benzocyclobutene (BCB), epoxy resin, phenol resin, unsaturated polyester resin, vinyl ester resin, polyimide resin (PI), polyphenylene ether oxide resin (PPO), Bismaleimide triazine cyanate ester resin, fumarate resin, polybutadiene resin, polyvinylbenzyl ether resin.

It may also be possible that the resin material used as the material of the insulator body 11 is any of various transparent resins. Use of a transparent resin as the material of the insulator body 11 may enable visual recognition of the internal conductor 20 from the outside of the electronic component 100. Thus, it is possible to visually confirm that the direction of the electronic component 100 is correct when it is mounted.

In an embodiment of the present invention, the filler particles used for the insulator body 11 may be, e.g., particles of a ferrite material, metal magnetic particles, particles of an inorganic material such as $SiO_2$ or $Al_2O_3$, or glass-based particles. Particles of a ferrite material used for the insulator body 11 may be, for example, particles of Ni—Zn ferrite or particles of Ni—Zn—Cu ferrite. Metal magnetic particles used for the insulator body 11 may be made of a material in which magnetism is developed in an unoxidized metal portion, and may be, for example, particles including unoxidized metal particles or alloy particles.

Metal magnetic particles applicable to the present invention may include particles of, for example, Fe, an Fe—Si—Cr, Fe—Si—Al, or Fe—Ni alloy, an Fe—Si—Cr—B—C or Fe—Si—B—Cr amorphous alloy, or a material obtained by mixing them. Pressurized powder bodies obtained from these types of particles can also be used as the metal magnetic particles for the insulator body 11. Moreover, these types of particles or pressurized powder bodies obtained therefrom each having a surface thermally treated to form an oxidized film thereon can also be used as the metal magnetic particles for the insulating body 11. The metal magnetic particles for the insulator body 11 can be manufactured by, for example, an atomizing method. Furthermore, it may also be possible that metal magnetic particles for the insulator body 11 are manufactured by a known method other than atomizing methods. Furthermore, commercially available metal magnetic particles can also be used for the insulator body 11. Examples of commercially available metal magnetic particles may include PF-20F manufactured by Epson Atmix Corporation and SFR-FeSiAl manufactured by Nippon Atomized Metal Powders Corporation.

The filler particles used for the insulator body 11 may be made of a material having a lower density than the resin used for the insulator body 11. Thus, the weight of the electronic component 100 can be reduced.

The internal conductor 20 may be provided inside the base member 10. In an embodiment of the present invention, the internal conductor 20 may include a plurality of pillared conductive members 21 and a plurality of connecting conductive members 22. The plurality of pillared conductive members 21 and the plurality of connecting conductive members 22 may constitute a coil portion 20L.

The plurality of pillared conductive members 21 may be each formed in a substantially columnar shape with a central axis thereof arranged in parallel with the Z-axis direction. In an embodiment of the present invention, the plurality of pillared conductive members 21 may have a circular, elliptic, or oval cross section cut along the direction perpendicular to the central axis. When the plurality of pillared conductive members 21 have an elliptic or oval cross section cut along the direction perpendicular to the central axis, the ratio of the major axis to the minor axis may be not greater than 3. The plurality of pillared conductive members 21 may be divided into two groups separated from each other in the substantially Y-axis direction. One of these groups may include a plurality of first pillared conductive members 211. The plurality of first pillared conductive members 211 may be arranged in the X-axis direction at intervals. The other group may include a plurality of second pillared conductive members 212. The plurality of second pillared conductive members 212 may also be arranged in the X-axis direction at intervals.

The first pillared conductive members 211 and the second pillared conductive members 212 may be configured to have about the same diameter and about the same height. In the illustrated example, the group of the first pillared conductive members 211 and the group of the second pillared conductive members 212 may include five members each. As will be described later, the first and second pillared conductive members 211, 212 may be formed by stacking more than one via conductive members in the Z-axis direction. The reason why the pillared conductive members have substantially the same radius is to prevent increase of resistance, and this may be achieved when variation in the dimension of the pillared conductive members as viewed in the same direction is reduced to 10% or smaller. The reason why the pillared conductive members have substantially the same height is to secure stacking accuracy of the layers, and this may be achieved when a difference in the height of the pillared conductive members is reduced to, for example, 10 μm or smaller.

The plurality of connecting conductive members 22 may be divided into two groups that are formed in parallel with the XY plane and opposed to each other in the Z-axis direction. One of these groups may include a plurality of first connecting conductive members 221, and the other may include a plurality of second connecting conductive members 222. In the illustrated example, the group of the first connecting conductive members 221 may include five connecting conductive members and the group of the second connecting conductive members 222 may include four connecting conductive members.

The plurality of first connecting conductive members 221 may be arranged between the first pillared conductive members 211 and the second pillared conductive members 212. The plurality of first connecting conductive members 221 may extend along the Y-axis direction and may be arranged in the X-axis direction at intervals. The plurality of second connecting conductive members 222 may be arranged between the first pillared conductive members 211 and the second pillared conductive members 212. The plurality of second connecting conductive members 222 may extend at an angle with respect to the Y-axis direction and may be arranged in the X-axis direction at intervals.

The first connecting conductive members 221 are each connected with upper ends of a pair of pillared conductive members 211, 212, and the second connecting conductive members 222 are each connected with lower ends of a pair of pillared conductive members 211, 212. The first and second pillared conductive members 211, 212 and the first and second connecting conductive members 221, 222 may be connected to each other so as to form a rectangular helix in the X-axis direction. Thus, provided in the inside of the base member 10 is the coil portion 20L that has the central axis (a coil axis) extending in the X-axis direction and has a rectangular opening.

The internal conductor 20 may further include an extended portion 23 and a comb-tooth block portion 24 that connect between the coil portion 20L and the external electrode 30 (31, 32).

The internal conductor 20 may be formed of a metal material having excellent conductivity such as Cu (copper), Al (aluminum), Ni (nickel), or Ag (silver).

The extended portion 23 may include a first extended portion 231 and a second extended portion 232. The first extended portion 231 may be coupled to a lower end of the first pillared conductive member 211 that forms one end of the coil portion 20L, and the second extended portion 232 may be coupled to a lower end of the second pillared conductive member 212 that forms the other end of the coil portion 20L. The first and second extended portions 231, 232 may be provided in the same XY plane as the second connecting conductive members 222 and may be arranged in parallel with the Y-axis direction.

The comb-tooth block portion 24 may include a first comb-tooth block portion 241 and a second comb-tooth block portion 242. The first comb-tooth block portion 241 and the second comb-tooth block portion 242 may be separated from each other in the Y-axis direction. Each of the first comb-tooth block portion 241 and the second comb-tooth block portion 242 may have a plurality of teeth. As shown in FIG. 1, the first and second comb-tooth block portions 241 and 242 are configured such that the distal ends of the teeth thereof face in the upward direction in FIG. 1.

A part of the first and second comb-tooth blocks 241, 242 may be exposed on the end surfaces 103, 104 and the mounting surface 102 of the base member 10. Each tooth of the first comb-tooth block portion 241 may be electrically connected to adjacent teeth at a portion near the lower end thereof or at other portions, and similarly, each tooth of the second comb-tooth block portion 242 may be electrically connected to adjacent teeth at a portion near the lower end thereof or at other portions.

The first and second extended portions 231, 232 may be coupled to a space between predetermined two adjacent teeth of the first and second comb-tooth block portions 241, 242, respectively (see FIG. 3).

At the bottom of the first and second comb-tooth block portions 241, 242, there may be provided conductor layers 301, 302 that constitute underlayers of the external electrode 30 (see FIG. 2). The conductor layers 301, 302 may be formed of a metal material such as Cu (copper), Al (aluminum), Ni (nickel), or Ag (silver).

Both the conductor layer 301 and the conductor layer 302 may have a flat shape. A protruding portion 301a may be formed on the end portion of the conductor layer 301 on the first end surface 103 side, and a protruding portion 302a may be formed on the end portion of the conductor layer 302 on the second end surface 104 side. As will be described later, the protruding portion 301a and the protruding portion 302a may be formed by a blade of a dicing saw in the process of dividing the electronic component from the wafer. In an embodiment of the present invention, the protruding portion 301a may be formed so as to curve toward the inner side of the electronic component 100 (that is, toward the protruding portion 302a). Likewise, the protruding portion 302a may be formed so as to curve toward the inner side of the electronic component 100 (that is, toward the protruding portion 301a).

On the surfaces of the conductor layer 301 and the conductor layer 302, there may be formed the external electrode 30. The external electrode 30 may serve as an external terminal for surface mounting. The external electrode 30 may include a first external electrode 31 and a second external electrode 32. The first external electrode 31 and the second external electrode 32 may be separated from each other in the Y-axis direction. The first external electrode 31 and the second external electrode 32 may be formed in the mounting surface 102 of the base member 10. The first external electrode 31 may extend onto the end surface 103, in addition to the mounting surface 102 of the base member 10. The second external electrode 32 may extend onto the end surface 104, in addition to the mounting surface 102 of the base member 10.

In an embodiment of the present invention, the first and second external electrodes 31, 32 may each include first electrode portions 30A that cover opposite end portions of the mounting surface 102 of the base member 10 in the Y-axis direction, and second electrode portions 30B that cover the end surfaces 103, 104 of the base member 10 over a predetermined height, as illustrated in FIG. 2. The first electrode portions 30A may be electrically connected to the bottoms of the first and second comb-tooth block portions 241, 242 through the conductor layers 301, 302, respectively. The second electrode portions 30B may be formed on the end surfaces 103, 104 of the base member 10 so as to cover the side portions of the first and second comb-tooth block portions 241, 242. When the side portions of the first and second comb-tooth block portions 241, 242 are exposed on the first end face 103 and the second end face 104, the second electrode portions 30B may be electrically connected to the side portions of the first and second comb-tooth block portions 241, 242.

In an embodiment of the present invention, a protrusion 305 may be formed at the end portion of the first external electrode 31 on the first end face 103 side, and a protrusion 306 may be formed at the end portion of the second external electrode 32 on the second end face 104 side. In an embodiment of the present invention, the protrusion 305 may be formed at a position corresponding to the protruding portion 301a of the conductor layer 301 in the Y direction. The protrusion 306 may be formed at a position corresponding to the protruding portion 302a of the conductor layer 302 in the Y direction.

In an embodiment of the present invention, the first external electrode 31 and the second external electrode 32 may be constituted by two plated layers. For example, the two plating layers may include, for example, a first plating layer that covers the conductor layer 301, the conductor layer 302, and both end faces 103, 104 of the base member 10 over a predetermined height and a second plating layer formed so as to cover the first plating layer. The first plating layer may be formed so as to cover the entire lower surfaces of the conductor layer 301 and the conductor layer 302 in order to protect the conductor layer 301 and the conductor layer 302. In an embodiment of the present invention, the first plating layer may be a nickel plating layer containing nickel (Ni). In an embodiment of the present invention, the second plating layer may be a tin plating layer containing tin (Sn).

In an embodiment of the present invention, the first external electrode 31 and the second external electrode 32 may be made of paste of an electrically conductive material. One example of the electrically conductive material may be Ag paste.

Figure 4:
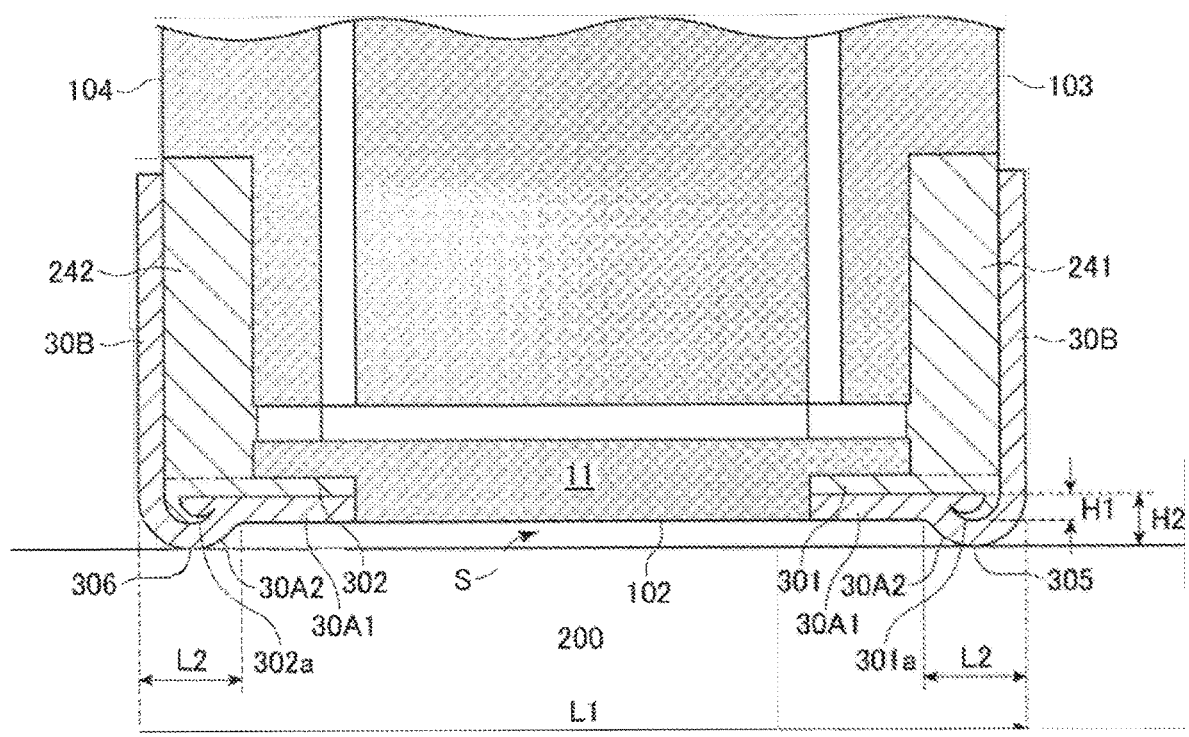
FIG. 4 is an enlarged sectional view showing the portion around the mounting surface of the electronic component of FIG. 1.
Figure 5:
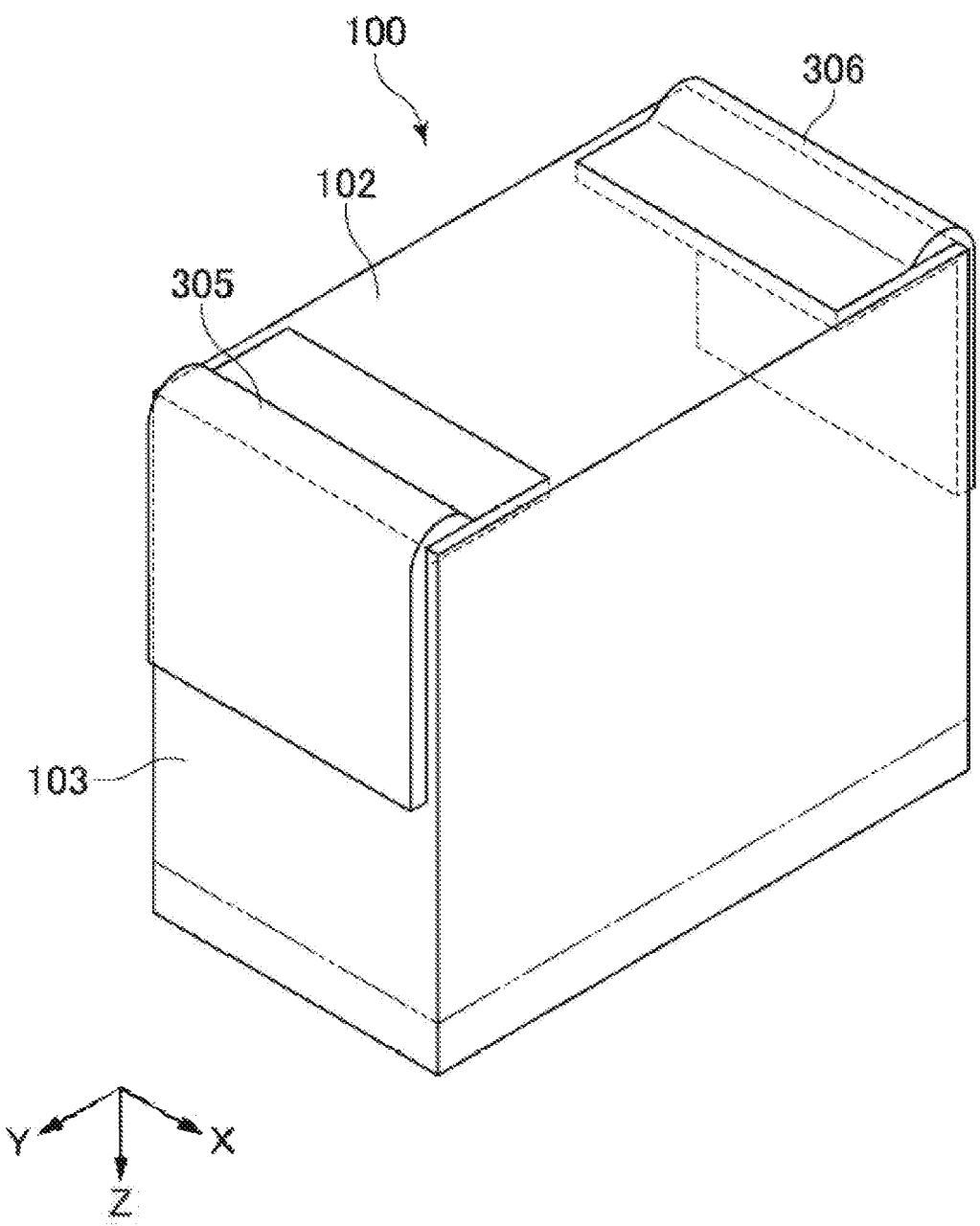
FIG. 5 is a perspective view of the electronic component of FIG. 1 as viewed from the mounting surface side.

With reference to FIG. 4 and FIG. 5, the first external electrode 31 and the second external electrode 32 of the electronic component 100 according to the embodiment of the present invention will be further described. FIG. 4 is an enlarged cross-sectional view of the vicinity of the mounting surface of the electronic component 100, and FIG. 5 is a perspective view of the electronic component 100 as viewed from the mounting surface side.

As shown, the first electrode portions 30A of the first external electrode 31 and the second external electrode 32 may include flat surfaces 30A1 and curved surfaces 30A2. The curved surfaces 30A2 may be connected to end portions of the flat surfaces 30A1 on the end surfaces 103, 104 side and may be constituted by curved surfaces. In an embodiment of the present invention, the flat surfaces 30A1 of the first external electrode 31 and the second external electrode 32 may be flush with the bottom surface 102 of the insulator body 11. The curved surface 30A2 of the first external electrode 31 may define the outer surface of the protrusion 305, and the curved surface 30A2 of the second external electrode 32 may define the outer surface of the protrusion 306.

In an embodiment of the present invention, The protrusion 305 may have a height H2 from the lower surface of the conductor layer 301 (that is, a height from the mounting surface 102 of the electronic component 100) ranging from 5 μm to 50 μm, from 6 μm to 30 μm, or from 7 μm to 15 μm. To achieve such a height of the protrusion 305, the protruding portion 301a of the conductor layer 301 may have a height H1 from the lower surface of the conductor layer 301 ranging from 1 μm to 45 μm, from 2 μm to 25 μm, or from 3 μm to 10 μm.

In an embodiment of the present invention, the protrusion 305 may be formed such that the length L2 thereof in the length direction of the electronic component 100 (Y direction) is 1/100 to 1/10 of the length L1 of the electronic component 100.

The protrusion 306 may have the same dimensions as the protrusion 305.

Thus, the protrusion 305 may be formed on the surface of the external electrode 31 and the protrusion 306 may be formed on the surface of the external electrode 32, and therefore, a standoff S may be formed between the mounting surface 102 of the electronic component 100 and the mounting board 200. This standoff S may be defined by the mounting surface 102 of the electronic component 100, the surface of the mounting board 200, and the flat surfaces 30A1 and the curved surfaces 30A2 of the first external electrode 31 and the second external electrode 32. When the electronic component 100 is soldered to the mounting board 200, the standoff S may be filled with solder.

Further, when inspecting the electrical characteristics of the electronic component using a contact probe (not shown), a larger pressure may act on the electronic component 100 from the contact probe at the positions of the protrusion 305 and the protrusion 306. With this pressure, the oxide film formed on the first external electrode 31 and the second external electrode 32 can be pushed away, so that the increase in the contact resistance value of the contact probe may be suppressed and the inspection can be performed accurately.

Figure 6:
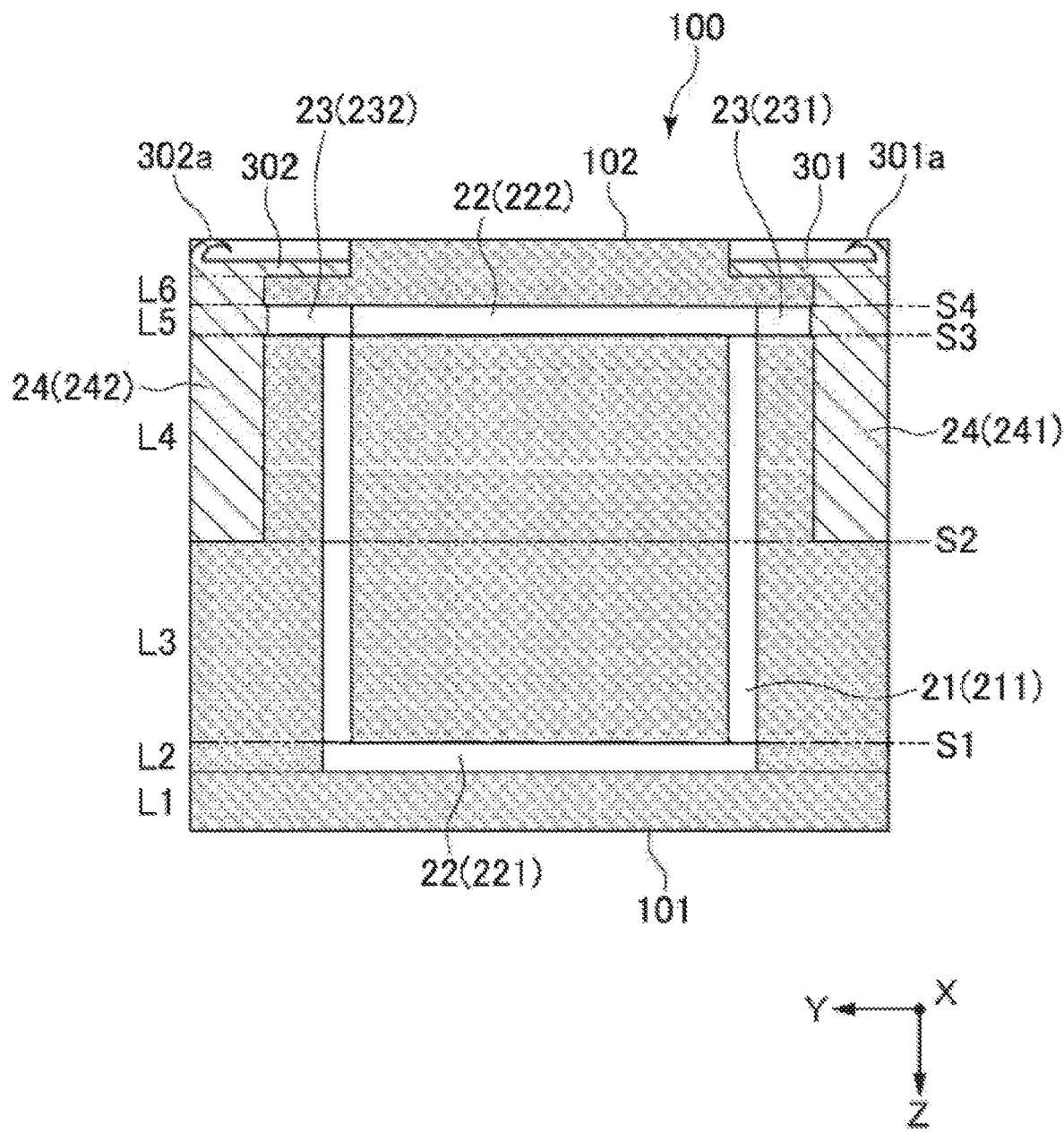
FIG. 6 is a schematic side view of the inverted electronic component.

Next, the lamination structure of the electronic component 100 will be described with reference to FIG. 6 and FIG. 7. FIG. 6 is a schematic side view of the inverted electronic component 100; and FIGS. 7A to 7F are schematic top views of a film layer L1 and electrode layers L2-L6 of FIG. 6. The external electrode 30 is omitted in FIG. 6 and FIG. 7.

Referring to FIG. 6, the electronic component 100 may be laminated with a film layer L1 and electrode layers L2-L6. The electrode layers L2-L6 may be stacked in the height direction with bonding surfaces S1-S4 (see FIG. 6) interposed therebetween. The film layer L1 and the electrode layers L2-L6 may include elements of the base member 10 and the internal conductor 20. The laminate including the film layer L1 and the plurality of electrode layers L2-L6 stacked together may be manufactured by a build-up method. In the embodiment, the film layer L1 and the electrode layers L2-L6 may be stacked sequentially in the Z-axis direction from the top surface 101 to the mounting surface 102. Conversely, it may also be possible that the film layer L1 and the electrode layers L2-L6 may be sequentially stacked from the mounting surface 102 to the top surface 101. The number of the layers is not particularly limited, and it may be six in this example. The laminate including the film layer L1 and the electrode layers L2-L6 stacked together is manufactured not in the unit of an element (the unit of a component) but in the unit of a wafer including a large number of elements (components). FIG. 6 shows only a region corresponding to one element among the laminates manufactured in the unit of a wafer.

Figure 7A:
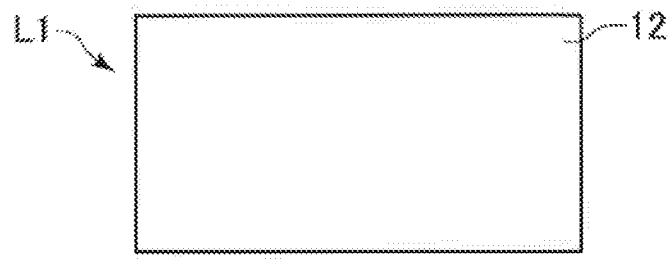
FIGS. 7A to 7F are schematic top views of electrode layers constituting the electronic component of FIG. 1.
Figure 7B:
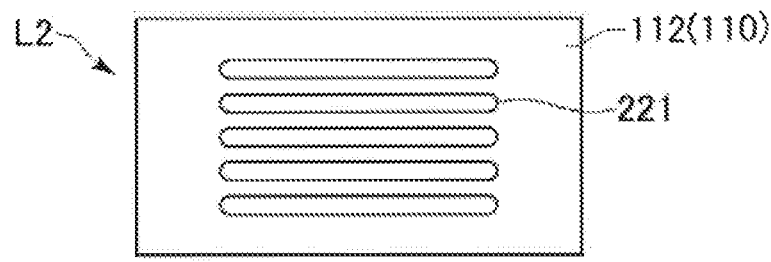
Figure 7C:
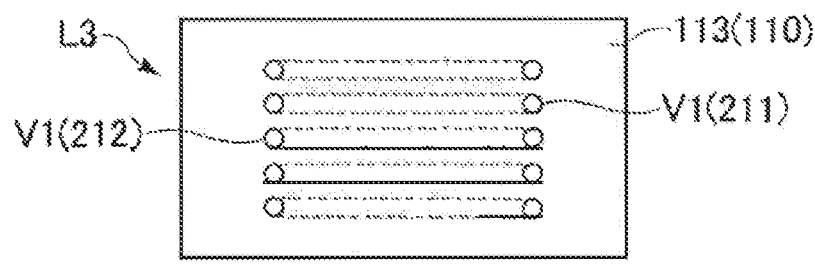
Figure 7D:
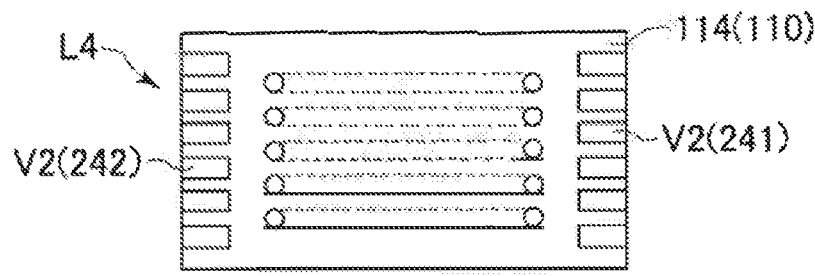
Figure 7E:
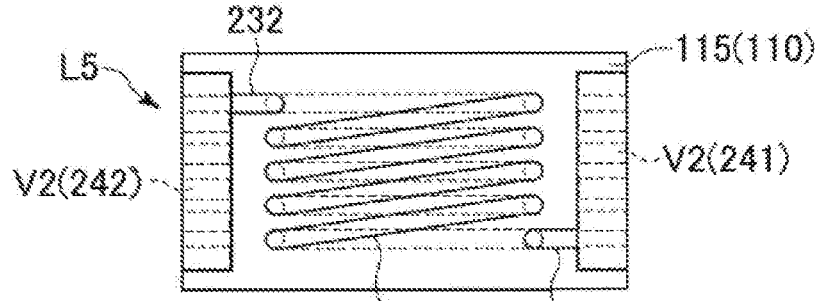
Figure 7F:
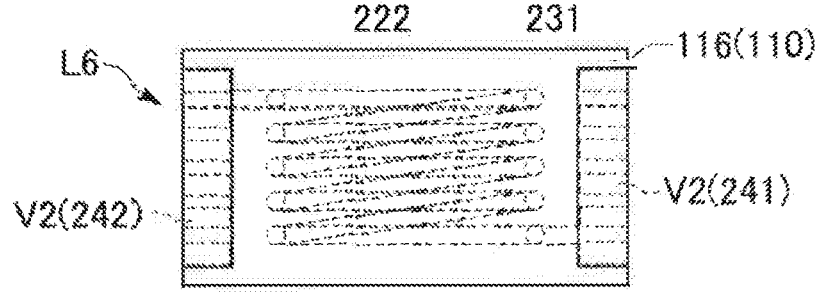

The film layer L1 may be constituted by the top surface layer 12 that provides the top surface 101 of the base member 10 (FIG. 7A). The electrode layer L2 may include an insulating layer 110 (112) that forms a part of the base member 10 (the insulator body 11), and the first connecting conductive members 211 (FIG. 7B). The electrode layer L3 may include the insulating layer 110 (113), and via conductive members V1 that form a part of the pillared conductive members 211, 212 (FIG. 7C). The electrode layer L4 may include the insulating layer 110 (114), the via conductive members V1, and via conductive members V2 that form a part of the comb-tooth block portions 241, 242 (FIG. 7D). The electrode layer L5 may include the insulating layer 110 (115), the via conductive members V1, V2, the extended portions 231, 232, and the second connecting conductive members 222 (FIG. 7E). The electrode layer L6 may include the insulating layer 110 (116) and the via conductive members V2 (FIG. 7F).

Figure 8A:
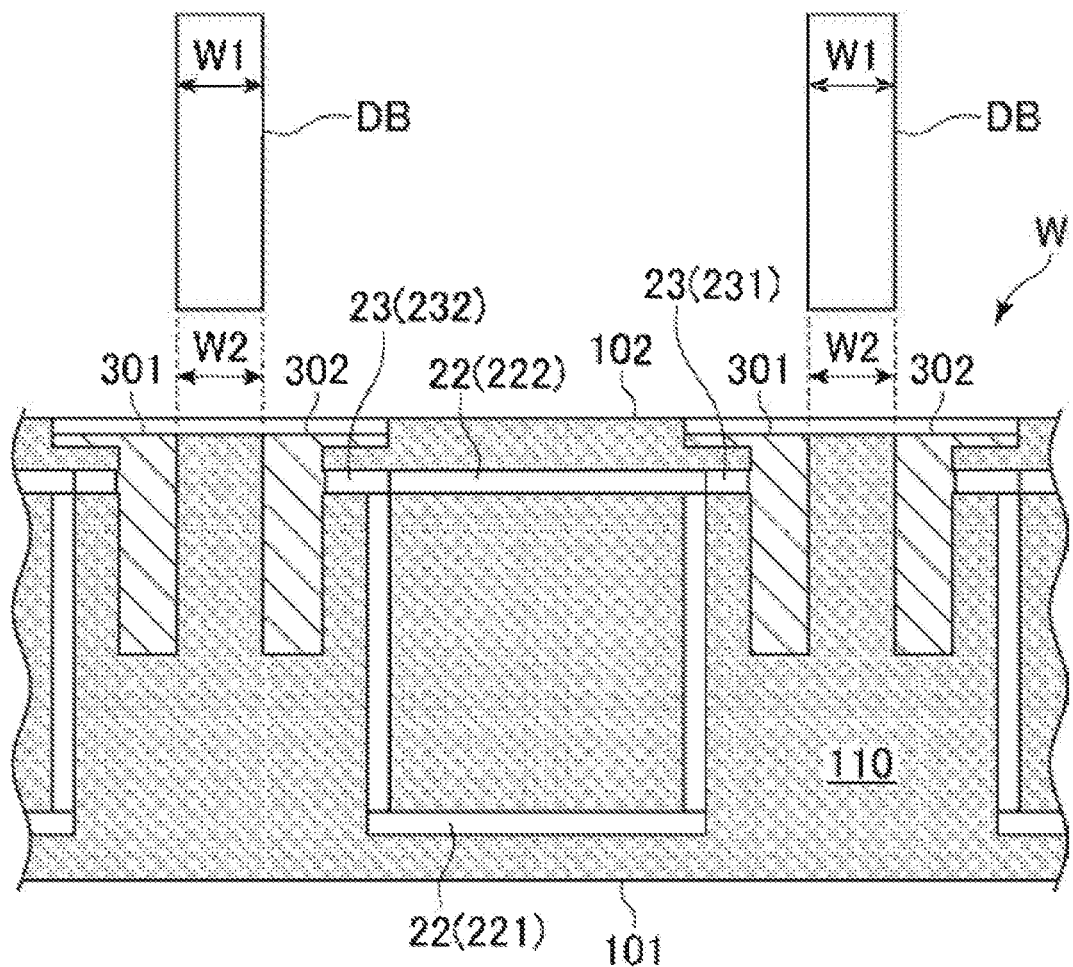
FIG. 8A is a schematic view showing a chip forming process for obtaining the electronic component of FIG. 1 from a wafer.

Next, a manufacturing process of the electronic component 100 will be described with reference to FIGS. 8A to 8D. First, as shown in FIG. 8A, a wafer W having the lamination structure shown in FIG. 6 is manufactured by, e.g., the build-up method described above.

Next, the wafer W may be cut into the size of a unit component. The cutting of the wafer W may be performed using, for example, a blade DB of a dicing saw. Each of the electrode layers L2-L6 of the wafer W is formed such that the interval W2 between the conductor layer 301 of one unit component and the conductor layer 302 of another unit component adjacent to the one unit component in the length direction may be slightly smaller than the width W1 of the blade DB of the dicing saw. In an embodiment of the present invention, the interval W2 may be 0.1% to 10% smaller than W1. In an embodiment of the present invention, the interval W2 may be 0.5%, 1.0%, 1.5%, 2.0%, 2.5%, 3.0%, 3.5%, 4.0%, 4.5%, 5.0%, 5.5%, 6.0%, 6.5%, 7.0%, 7.5%, 8.0%, 8.5%, 9.0%, 9.5%, 10.0%, 20.0%, or 30.0% smaller than W1.

Figure 8B:
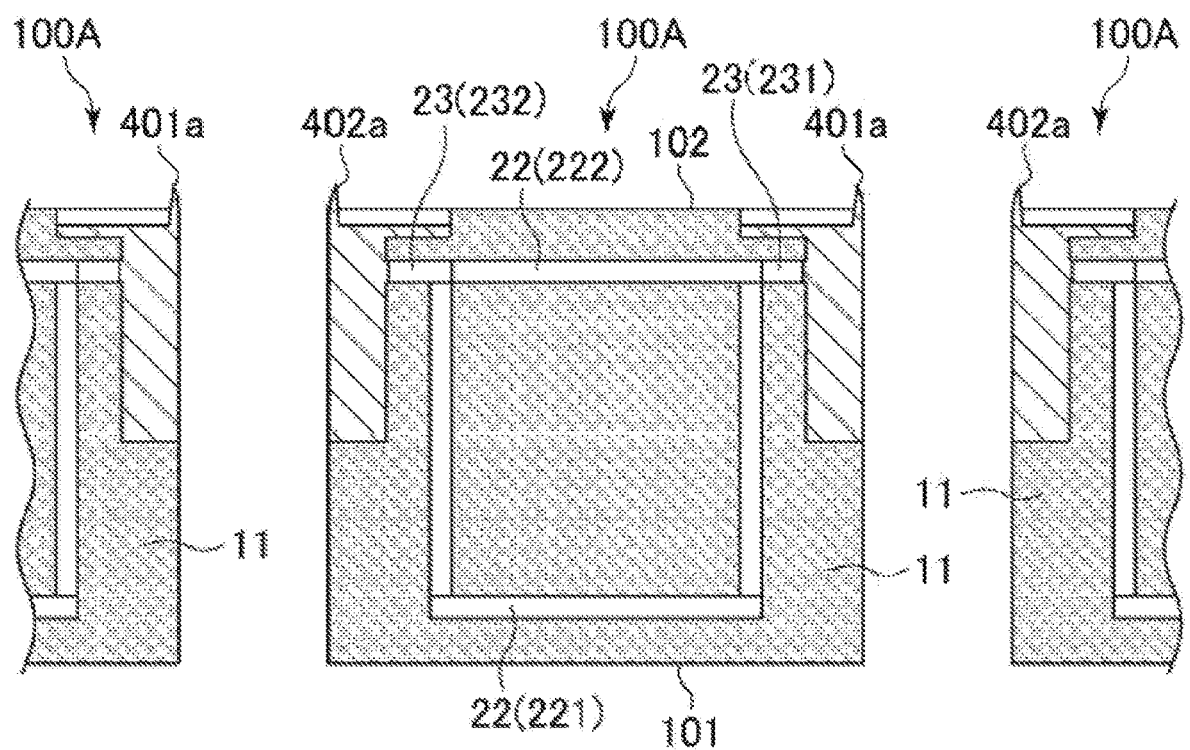
FIG. 8B is a schematic view showing a chip forming process for obtaining the electronic component of FIG. 1 from a wafer.

The blade DB, which moves farther or closer with respect to the plane of paper, may be inserted between the conductor layer 301 of one unit component formed in the wafer W and the conductor layer 302 of another unit component adjacent to the one unit component in the length direction. Thus, as shown in FIG. 8B, the wafer W may be divided into unit elements (divided into chips).

Since the wafer W is divided with the blade DB having a width W1, the blade DB may contact the side surfaces of the conductor layer 301 and the conductor layer 302 during cutting of the wafer W. As a result, as shown in FIG. 8B, burrs 401a and burrs 402a may be formed at the end portions of the conductor layer 301 and the conductor layer 302, respectively, in the divided laminate 100A.

Figure 8C:
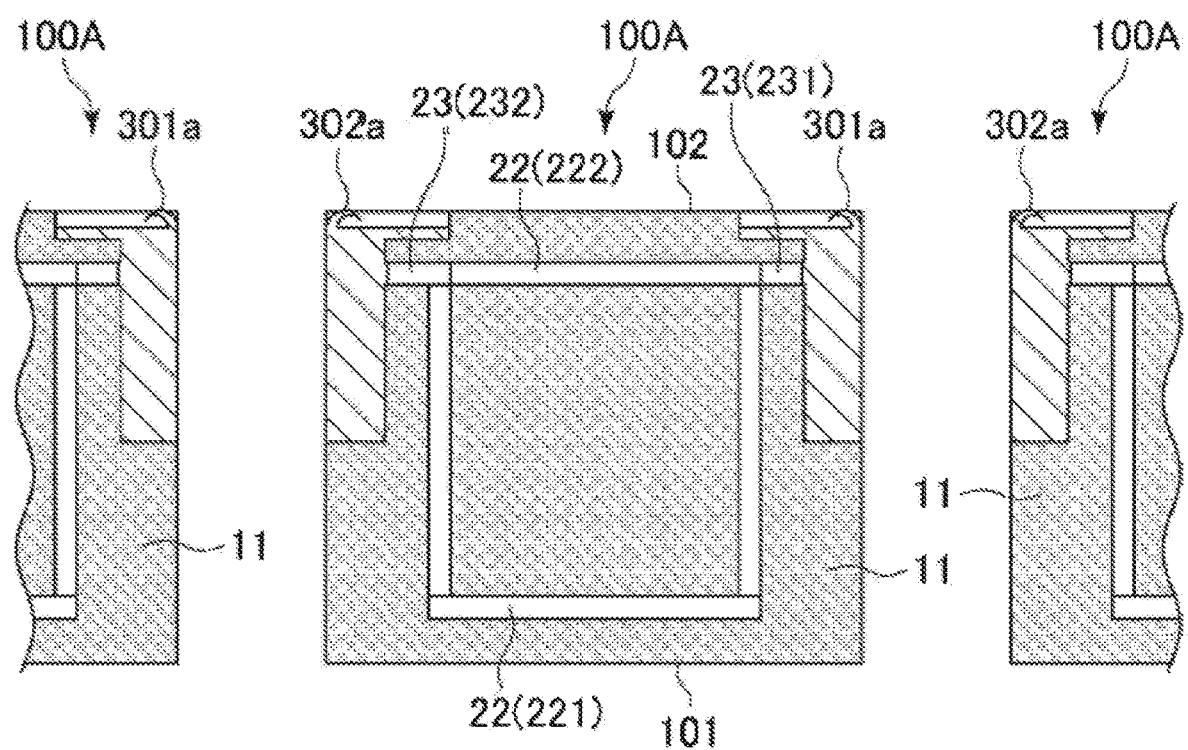
FIG. 8C is a schematic view showing a chip forming process for obtaining the electronic component of FIG. 1 from a wafer.

Next, the burrs 401a and the burrs 402a may be curved toward the inner side of the laminate 100A to form the protruding portion 301a and the protruding portion 302a, respectively. The protruding portion 301a and the protruding portion 302a thus formed may be curved toward each other, as shown in FIG. 8C. The step of curving the burrs 401a and the burrs 402a may be performed by, e.g., barrel processing.

Figure 8D:
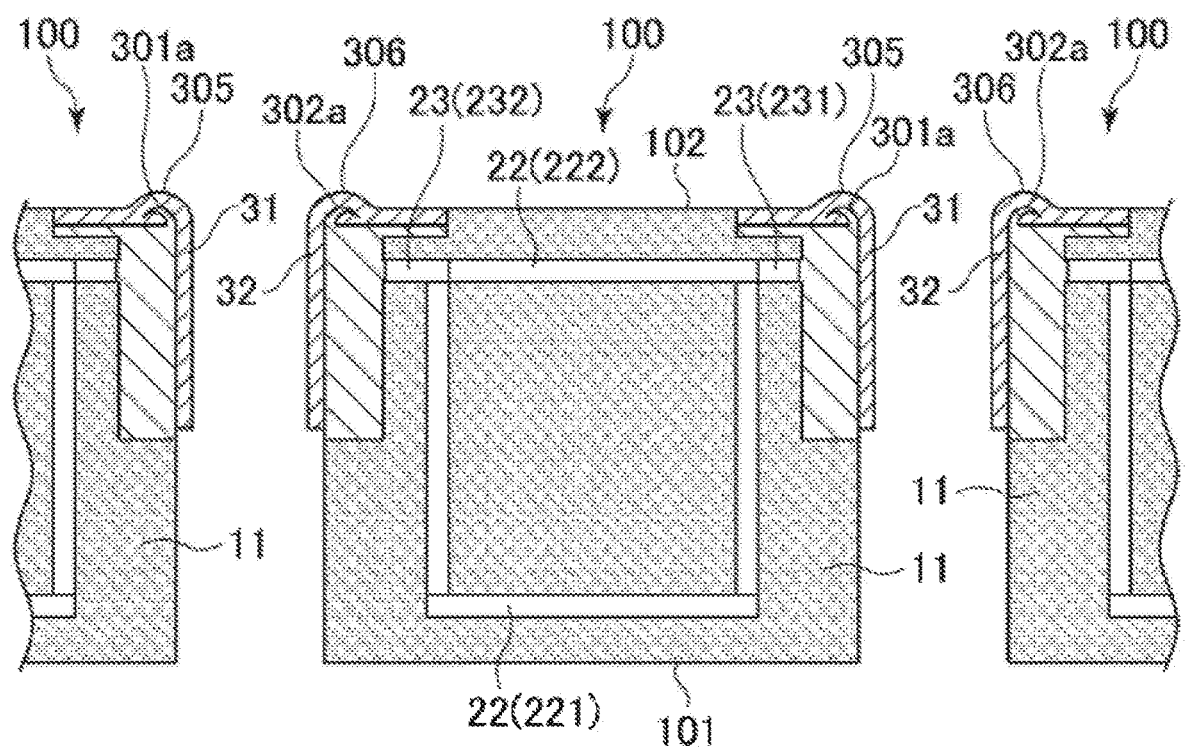
FIG. 8D is a schematic view showing a chip forming process for obtaining the electronic component of FIG. 1 from a wafer.

Next, as shown in FIG. 8D, the external electrode 31 and the external electrode 32 may be formed on the conductor layer 301 with the protruding portion 301a and the conductor layer 302 with the protruding portion 302a, respectively. The external electrode 31 and the external electrode 32 may be made of, for example, two plated layers including a Ni plating layer and a Sn plating layer. Thus, the protrusion 305 may be formed at a position in the external electrode 31 corresponding to the protruding portion 301a, and the protrusion 306 may be formed at a position in the external electrode 32 corresponding to the protruding portion 302a. In an embodiment of the present invention, the conductor layer 301 and the protruding portion 301a, and the conductor layer 302 and the protruding portion 302a may be continuously formed of the same material.

Thus, the wafer having a large number of electronic components (excluding the external electrodes 31, 32) formed therein may be divided, and the external electrodes 31, 32 may be formed on the divided laminates to obtain the electronic components 100.

The dimensions, material, and arrangement of the elements described herein are not limited to those explicitly described for the embodiments. The elements are susceptible of modifications for desired dimensions, materials, and arrangements within the scope of the present invention. The elements other than those explicitly described herein can be added to the described embodiments; and part of the elements described for the embodiments can be omitted.

What is claimed is:

1. A method of manufacturing an electronic component, comprising:
   preparing a wafer, the wafer including:
      a first unit internal conductor;
      a second unit internal conductor spaced at a distance from the first unit internal conductor;
      a first conductor layer provided on the first unit internal conductor;
      a second conductor layer provided on the second unit internal conductor; and
      a connection conductor layer connecting between the first conductor layer and the second conductor layer;
   cutting the wafer at a position of the connection conductor layer, so as to obtain a unit device including the first unit internal conductor and the first conductor layer;
   curving a burr formed on the first conductor layer, so as to form a protruding portion; and
   forming an external electrode on the first conductor layer of the first unit internal conductor so as to cover the protruding portion.

2. The method according to claim 1, wherein the wafer is cut using a blade having a blade width larger than the distance between the first unit internal conductor and the second unit internal conductor.

3. The method according to claim 2, wherein the burr is formed by the blade contacting the first conductor layer.

4. The method according to claim 2, wherein the blade width is 0.1 to 10 percent larger than the distance between the first unit internal conductor and the second unit internal conductor.

5. The method according to claim 2, wherein a burr is formed at an end portion of the second conductor layer by the blade contacting the second conductor layer.

6. The method according to claim 1, wherein the burr is formed at an end portion of the first conductor layer.

7. The method according to claim 1, wherein the burr is curved toward the first unit internal conductor.

8. The method according to claim 1, wherein the burr is curved by barrel processing.

9. The method according to claim 1, wherein the first conductor layer, the second conductor layer, and the connection conductor layer are recessed from a surface of the wafer toward an interior of the wafer.

10. The method according to claim 1, wherein the burr protrudes from a surface of the wafer.

11. A method of manufacturing an electronic component surface-mountable on a circuit board by cutting a wafer, wherein the electronic component includes:
   an insulating base member having a mounting surface and first and second end surfaces, the electronic component being surface-mountable on the circuit board such that the mounting surface faces the circuit board, the first and second end surfaces being opposed to each other and connected with each other via the mounting surface;

an internal conductor provided in the base member;
a first external electrode provided on the mounting surface of the base member so as to be electrically connected to the internal conductor; and
a second external electrode provided on the mounting surface of the base member so as to be electrically connected to the internal conductor,
wherein the first external electrode has a first protrusion formed thereon, and the second external electrode has a second protrusion formed thereon,
wherein the first external electrode includes a first electrode portion and a second electrode portion, the first electrode portion being flush with the mounting surface of the base member, the second electrode portion being provided on the first end surface of the base member,
wherein the second external electrode includes a third electrode portion and a fourth electrode portion, the third electrode portion being flush with the mounting surface of the base member, the fourth electrode portion being provided on the second end surface of the base member, and
wherein the first protrusion is formed on the first electrode portion of the first external electrode, and the second protrusion is formed on the third electrode portion of the second external electrode.

* * * * *